United States Patent [19]

Ohsawa et al.

[11] Patent Number: 5,229,966
[45] Date of Patent: Jul. 20, 1993

[54] CURRENT CONTROL CIRCUIT FOR DYNAMIC MEMORY

[75] Inventors: Takashi Ohsawa, Yokohama; Noriaki Ohba, Tokyo, both of Japan

[73] Assignee: Kabushiki Kaisha Toshiba, Kanagawa, Japan

[21] Appl. No.: 701,881

[22] Filed: May 17, 1991

[30] Foreign Application Priority Data

May 18, 1990 [JP] Japan .................. 2-130050

[51] Int. Cl.$^5$ .................. G11C 7/00; G11C 11/40
[52] U.S. Cl. .................. 365/189.09; 365/227; 365/230.08
[58] Field of Search .................. 365/189.09, 226, 227, 365/230.08

[56] References Cited

U.S. PATENT DOCUMENTS 4,937,789  6/1990  Matsubara .................. 365/189.09 X
5,001,668  3/1991  Ito et al. .................. 365/189.09

Primary Examiner—Siegfried H. Grimm
Attorney, Agent, or Firm—Banner, Birch, McKie & Beckett

[57] ABSTRACT

As latch circuit is supplied with a readout control signal for reading out data and a reference voltage for determining "1" or "0" of address data. The latch circuit latches address data for selecting a memory cell array according to the readout control signal and the reference voltage. A reference voltage generation circuit for generating the reference voltage includes resistors connected between first and second power sources and an output node which is connected between the resistors and from which the reference voltage is output. A transistor serving as an interruption circuit for interrupting the current path is connected between the first power source and the resistor. The transistor is turned off to interrupt a through current flowing between the first and second power sources when the readout signal is set in the stand-by state.

14 Claims, 8 Drawing Sheets

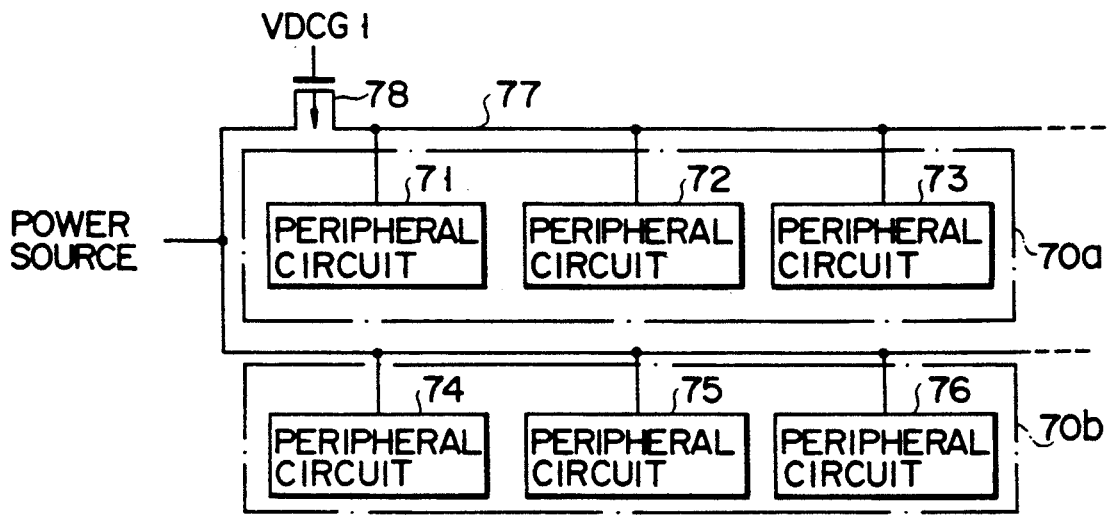
F I G. 7
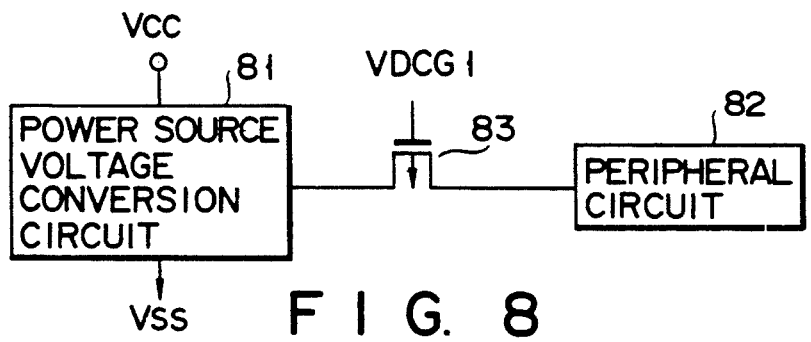
F I G. 8
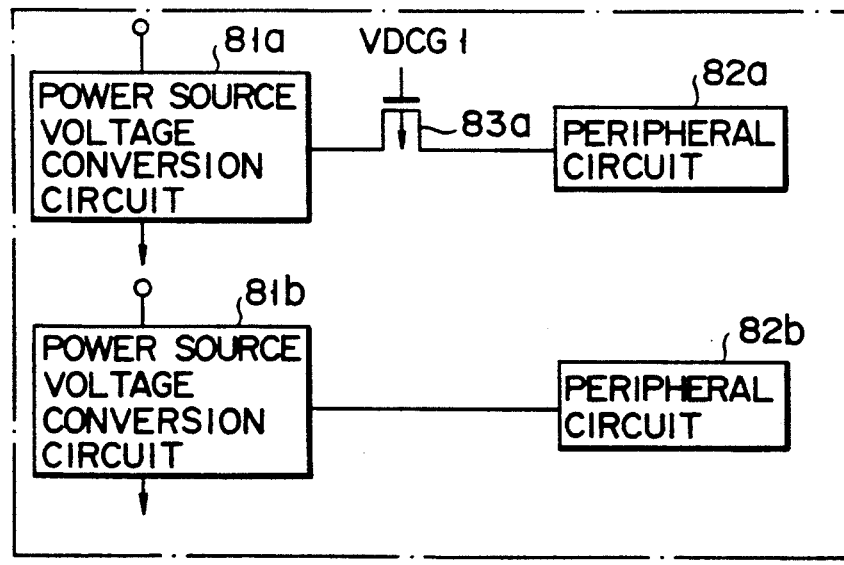
F I G. 9

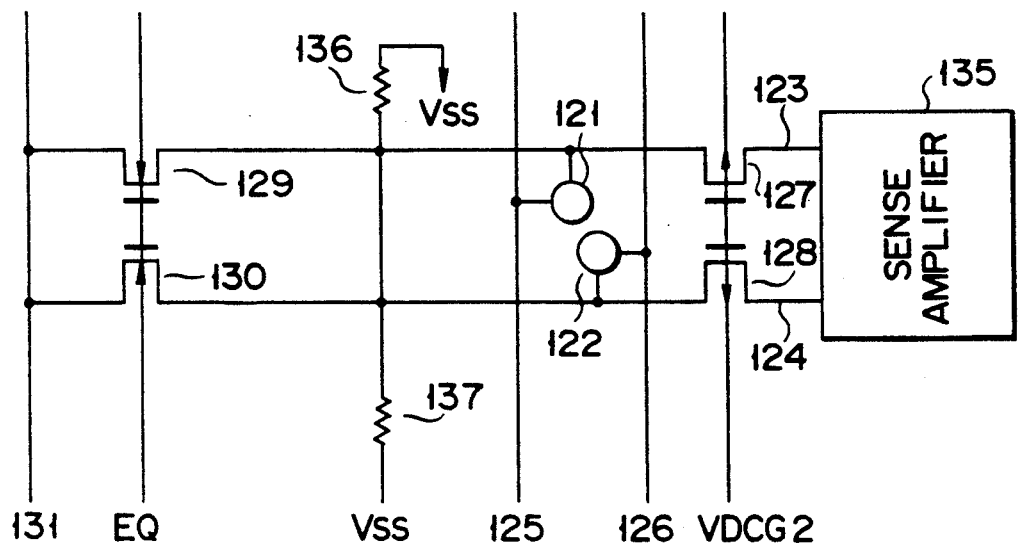
F I G. 14

CURRENT CONTROL CIRCUIT FOR DYNAMIC MEMORY

BACKGROUND OF THE INVENTION

1. Field of the Invention

This invention relates to a current control circuit for a dynamic memory used in the field of a speech processing device, image processing device and the like which particularly require a low power consumption.

2. Description of the Related Art

In general, since a dynamic memory necessitates a refresh operation and a through current flowing therein is large, the current consumption in the dynamic memory is large. In the dynamic memory, the through current mainly occurs in a reference potential generation circuit. The reference potential generation circuit is a circuit for supplying a reference potential Vref used for recognizing "1" or "0" of an address to a latch circuit for latching address data.

FIG. 16 shows an example of the conventional reference potential generation circuit. In this circuit, resistors R1 and R2 are serially connected between a first potential Vcc and a second potential Vss and a reference potential Vref is derived from a connection node between the resistors R1 and R2. Therefore, in this type of circuit, a through current will inevitably flow from the first potential Vcc to the second potential Vss.

In addition, a through current may occur in a short-circuited portion of the word line and bit line. When the word line and bit line are short-circuited, the dynamic memory is usually dealt as a defective device. However, when it is compensated by use of the redundancy technique, it may be used as an effective device but a through current occurs in the short-circuited portion.

Recently, it is required to use the dynamic memory in the speech processing and image processing or use the same instead of a magnetic disk. However, as described above, the current consumption in the dynamic memory is large and it is extremely difficult to back up the dynamic memory by means of a battery or the like. Therefore, it is difficult to apply the conventional dynamic memory in the field in which low power consumption is required.

At present, in the field in which low power consumption is required, a static memory is used. However, since the unit price for each bit is extremely high in the static memory than in the dynamic memory, the cost of the circuit becomes extremely high.

In the field in which low power consumption is required, the following methods have been proposed to permit use of the dynamic memory. In a first method, the refresh cycle is set to be longer than the cycle ensured by the data sheet for the standard product so as to reduce a refresh current. In a second method, the power source voltage is lowered in a stand-by state in which no data readout operation is effected. However, the above methods are not considered effective since the memory cell potential is varied and determination of "1" or "0" cannot be correctly made if the power source voltage is varied.

SUMMARY OF THE INVENTION

A object of this invention is to provide a current control circuit for a dynamic memory of low power consumption in which the flow of through current is prevented and almost no current is permitted to flow in the stand-by state.

The above object can be attained by a current control circuit for a dynamic memory comprising:

a memory cell array for storing data;

a latch circuit for latching address data for selecting the memory cell array according to a readout control signal for reading out data and a reference voltage for determining "1" or "0" of the address data, the readout control signal having a readout state for reading out data and a stand-by state in which no data is read out;

a reference voltage generation circuit having a resistor connected between first and second power sources, for generating the reference voltage; and an interruption circuit connected between the first power source and the resistor, for interrupting the current path between the first and second power sources.

That is, according to this invention, the interruption circuit is set in the OFF state to interrupt the current path between the first and second power sources when the readout control signal (/RAS: row address strobe) is set to a high level. Therefore, in the stand-by state, no through current flows between the first and second power sources so that the power consumption can be reduced, thereby permitting the dynamic memory to be backed up by a battery.

The same operation as that of the normal dynamic memory can be effected in the high-speed operation in which the /RAS varies in a short cycle by interrupting supply of potential by use of the interruption circuit only when the /RAS is kept at a high level for more than a preset period of time.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a constructional view showing a second embodiment of this invention;

FIG. 8 is a constructional view showing a third embodiment of this invention;

FIG. 9 is constructional view showing a modification of FIG. 8

FIG. 14 is a circuit diagram showing modification of FIG. 13;

DETAILED DESCRIPTION OF THE PREFERRED EMBODIMENTS

There will now be described an embodiment of this invention with reference to the accompanying drawings.

Figure 1A:
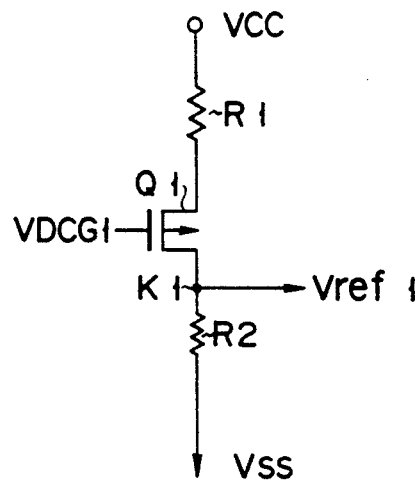
FIG. 1A is a circuit diagram showing a first embodiment of this invention.
Figure 1B:
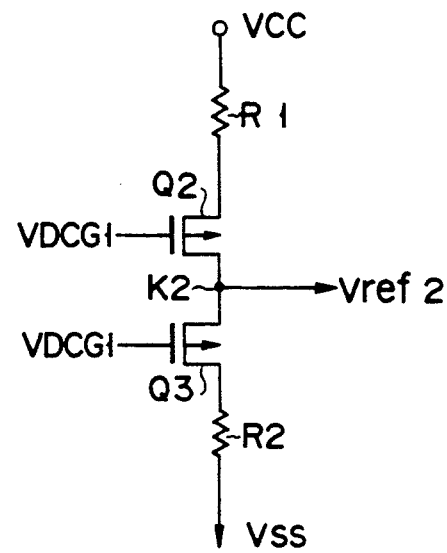
FIG. 1B is a circuit diagram showing a modification of the circuit shown in FIG. 1A.
Figure 2:
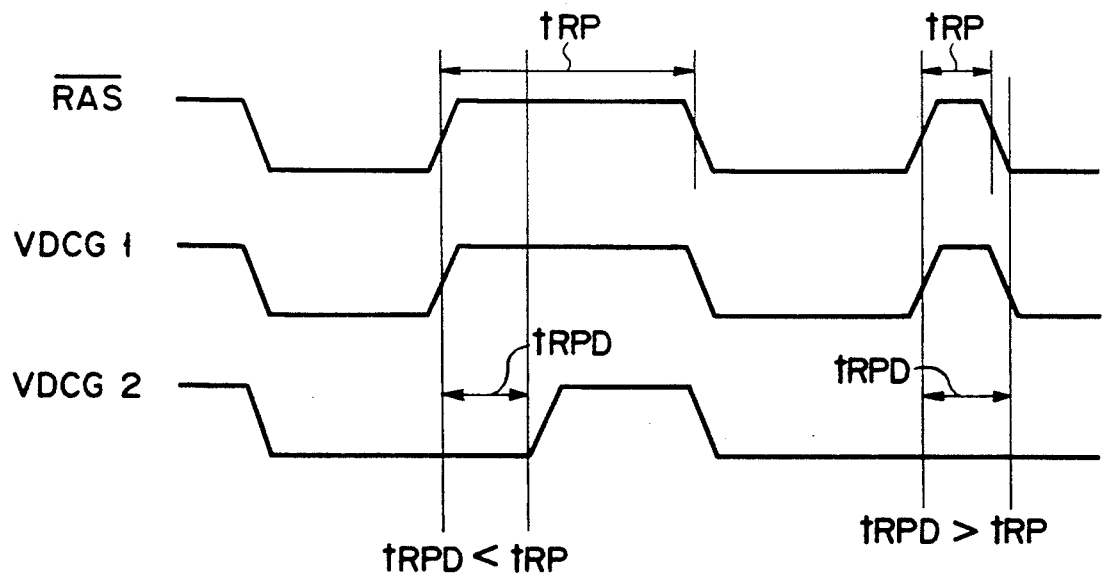
FIG. 2 is a waveform diagram for illustrating the operations of the circuits shown in FIGS. 1A and 1B.

FIGS. 1A and 1B show a first embodiment of this invention and show a through current prevention circuit in a reference potential generation circuit of a dynamic memory. In FIG. 1A, a resistor R1, a p-channel transistor Q1 and a resistor R2 are serially connected between a first potential Vcc and a second potential Vss and a reference potential Vref1 is derived from a connection node K1 between the p-channel transistor Q1 and the resistor R2. The reference potential Vref1 is supplied to a latch circuit shown in FIG. 15. As shown in FIG. 2, the transistor Q1 is controlled by a signal VDCG1 which is synchronized with a /RAS. In this case, the /RAS itself may be used as the control signal for the transistor Q1.

Figure 15:
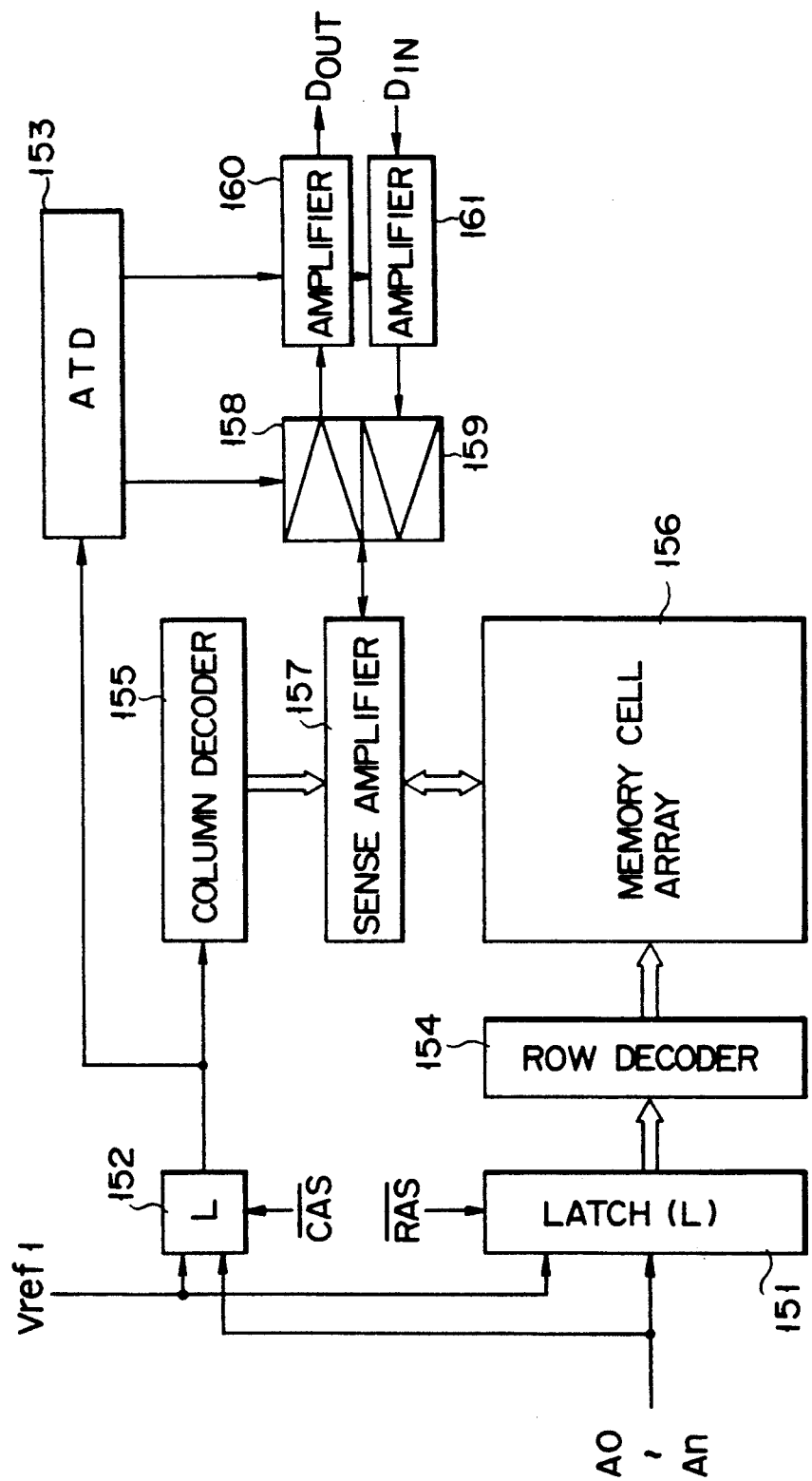
FIG. 15 is a constructional view showing an example of a dynamic memory to which this invention is applied.

FIG. 15 shows an example of a dynamic memory to which the reference potential generation circuit is connected. Address data is supplied to latch circuits (L) 151 and 152. The latch circuits 151 and 152 latch address data in response to a /RAS (row address strobe, / indicates the inverted form) or a /CAS (column address strobe, / indicates the inverted form). The latch circuits 151 and 152 are supplied with the reference potential Vref1 for determining "1" or "0" of the address data to be latched.

The latch circuit 151 is connected to a row decoder 154 and the latch circuit 152 is connected to a column decoder 155 and an address transition detector (ATD) 153 for detecting the address change. The row decoder 154 converts address data latched in the latch circuit 151 into a row address and the column decoder 155 converts address data latched in the latch circuit 152 into a column address. The row decoder 154 is connected to a memory cell array 156 and the column decoder 155 is connected to the memory cell array 156 via a sense amplifier 157. The memory cell array 156 selects a bit line and a word line which are not shown in the drawing in response to a row address supplied from the row decoder 154 and a column address supplied from the column decoder 155 via the sense amplifier 157. The sense amplifier 157 is sequentially connected to sense circuits 158 and 159 including gate circuits and amplifiers 160 and 161. The sense circuits 158 and 159 and the amplifiers 160 and 161 equalize bit lines (not shown) in response to an output signal of the ATD 153.

With the above construction, when the /RAS is set to a low level as shown in FIG. 2, the signal VDCG1 is also set to a low level, thereby turning on the transistor Q1. As a result, the reference potential Vref1 is output. On the other hand, when the /RAS is set to a high level, the signal VDCG1 is also set to a high level, thereby turning off the transistor Q1. As a result, the reference potential Vref1 is cut off and the flow of through current is prevented, and this state is maintained until the /RAS is again set to the low level.

When the /RAS is kept at the high level, the reference potential Vref1 approaches the second potential Vss and the reference potential Vref2 approaches the first potential Vcc or second potential Vss because of the leakage current.

When the /RAS is set to the low level, the reference potential generation circuit is operated to return the reference potential Vref1 to the original potential level. However, it is necessary to wait for reception of a row address until the reference potential Vref1 becomes stable. When the reference potential generation circuit shown in FIG. 1A is used, the potential becomes stable after approx. 1 $\mu$sec. Therefore, if the row address is received when at least 1 $\mu$sec has passed after the /RAS is set to the low level, the same operation as that of the normal dynamic memory can be effected.

FIG. 1B shows a modification of the circuit shown in FIG. 1A and shows a circuit in which a resistor R1, p-channel transistors Q2 and Q3 and a resistor R2 are serially connected between the first potential Vcc and the second potential Vss and a reference potential Vref2 is derived from a connection node K2 between the transistors Q2 and Q3. The transistors Q2 and Q3 are controlled by a signal VDCG1 which is synchronized with the /RAS shown in FIG. 2.

With the above construction, when the /RAS is set to the low level, the signal VDCG1 is also set to the low level, thereby turning on the transistors Q2 and Q3. As a result, the reference potential Vref2 is output. Further, when the /RAS is set to the high level, the signal VDCG1 is also set to the high level, thereby turning off the transistors Q2 and Q3. As a result, the reference potential Vref2 is cut off and no through cur rent is permitted to flow, and this state is maintained until the /RAS is again set to the low level.

When the /RAS is kept at the high level, the reference potential Vref2 approaches the first potential Vcc or second potential Vss because of the current leakage.

When the /RAS is set to the low level, the reference potential generation circuit is operated to return the reference potential to the original potential level. However, it is necessary to wait for reception of a row address until the reference potential Vref2 becomes stable. When the reference potential generation circuit shown in FIG. 1B is used, the potential becomes stable after approx. 1 $\mu$sec. Therefore, if the row address is received when at least 1 $\mu$sec has passed after the /RAS is set to the low level, the same operation as that of the normal dynamic memory can be effected.

Figure 3:
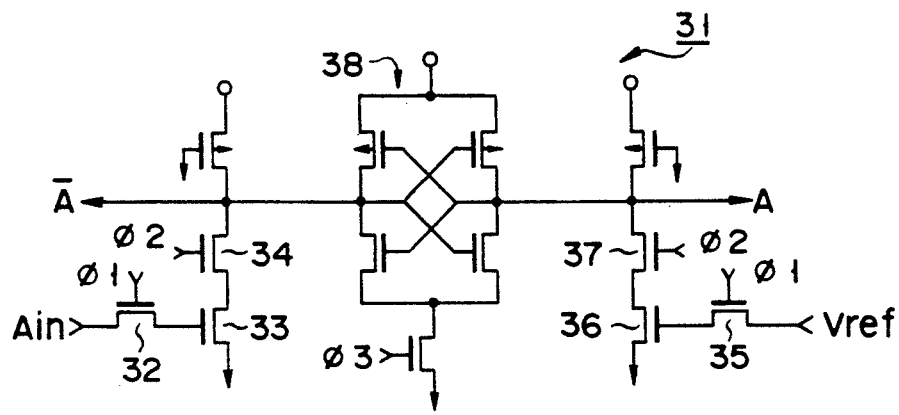
FIG. 3 is a circuit diagram showing an example of an address buffer connected to the circuits shown in FIGS. 1A and 1B.

FIG. 3 shows an example of a circuit for delaying reception of the row address and shows an address buffer circuit 31, for example. The address buffer circuit 31 corresponds to the latch circuits 151 and 152 shown in FIG. 15.

The address buffer circuit 31 is controlled by signals $\phi 1$, $\phi 2$ and $\phi 3$. That is, transistors 32 to 37 are turned on by the signals $\phi 1$ and $\phi 2$ so that address data Ain and the reference potential Vref can be input. A latch section 38 is operated in response to the signal $\phi 3$, and when the input address data Ain is higher than the reference potential Vref, a "1" level is held, and when the input address data Ain is lower than the reference potential Vref, a "0" level is held. Thus, reception of the address data Ain can be delayed by delaying the signals φ1, φ2 and φ3.

Figure 4:
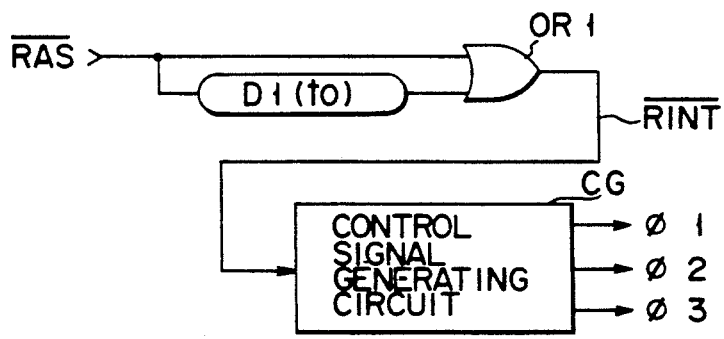
FIG. 4 is a circuit diagram for delaying reception of address supplied to the circuit shown in FIG. 3.
Figure 5:
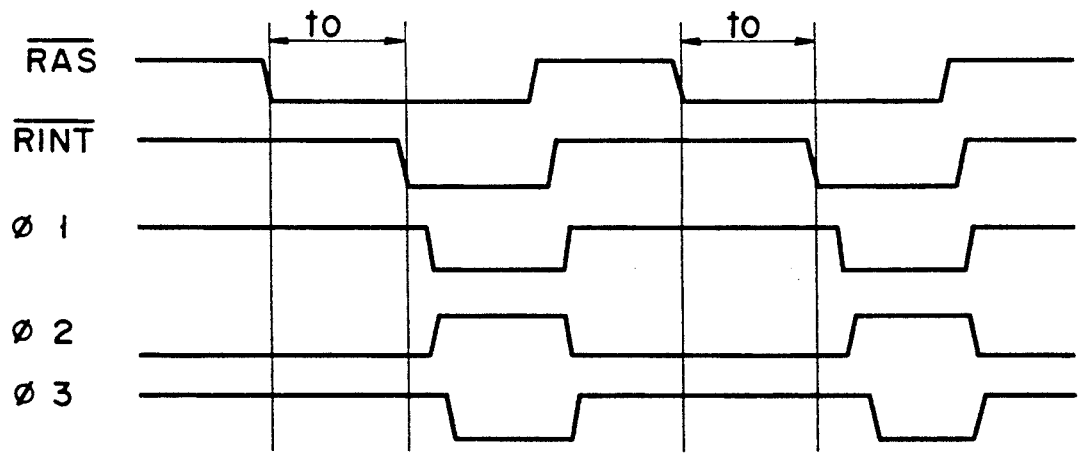
FIG. 5 is a waveform diagram for illustrating the operation of the circuit shown in FIG. 4.

FIG. 4 shows a circuit for generating the signals φ1, φ2 and φ3. The signals φ1, φ2 and φ3 are generated based on the /RAS. That is, the /RAS and an internal RAS delayed by a delay circuit D1 are supplied to an OR circuit OR1 and a signal /RINT is output from the OR circuit OR1. The signal /RINT is supplied to a control signal generation circuit CG of the row address buffer and the signals φ1, φ2 and φ3 are output from the control signal generation circuit CG. The control signal generation circuit CG is constituted by well known logic circuits. As shown in FIG. 5, with this construction, signals φ1, φ2 and φ3 which are delayed by time t0 with respect to the /RAS can be generated.

On the other hand, in the conventional reference potential generation circuit, an output impedance must be set to be high in order to prevent the flow of through current. Thus, even when the power source voltage is varied, the reference potential will not immediately respond to the variation and can be kept at a constant potential level for a preset period of time since the output impedance is high. In this case, it is considered that an address will be erroneously selected.

In contrast, in the above embodiment, since the reference potential generation circuit is not operated in the stand-by state, the output impedance can be made low. Therefore, the reference potential may immediately respond to variation in the power source voltage so that an address can be prevented from being erroneously selected.

Further, if the output impedance is made low, time for receiving the row address can be shortened.

Further, the signal VDCG2 shown in FIG. 2 can be used as a signal for driving the transistors Q1 to Q3. The signal VDCG2 is synchronized with the /RAS when the RAS is set to the low level, and is set to the high level with a preset delay time ($t_{RPD}$) with respect to the /RAS when the /RAS is set to the high level. When the signal VDCG2 is used, the signal VDCG2 is kept at the low level and the reference potential Vref1 or Vref2 is continuously output in the high-speed operation in which the /RAS is repeatedly changed from the low level to the high level and from the high level to the low level in a short period of time. Therefore, the dynamic memory which is supplied with the reference potential can be operated in exactly the same manner as the normal dynamic memory. That is, in the high-speed operation, it is not necessary to wait for reception of the row address.

Figure 6A:
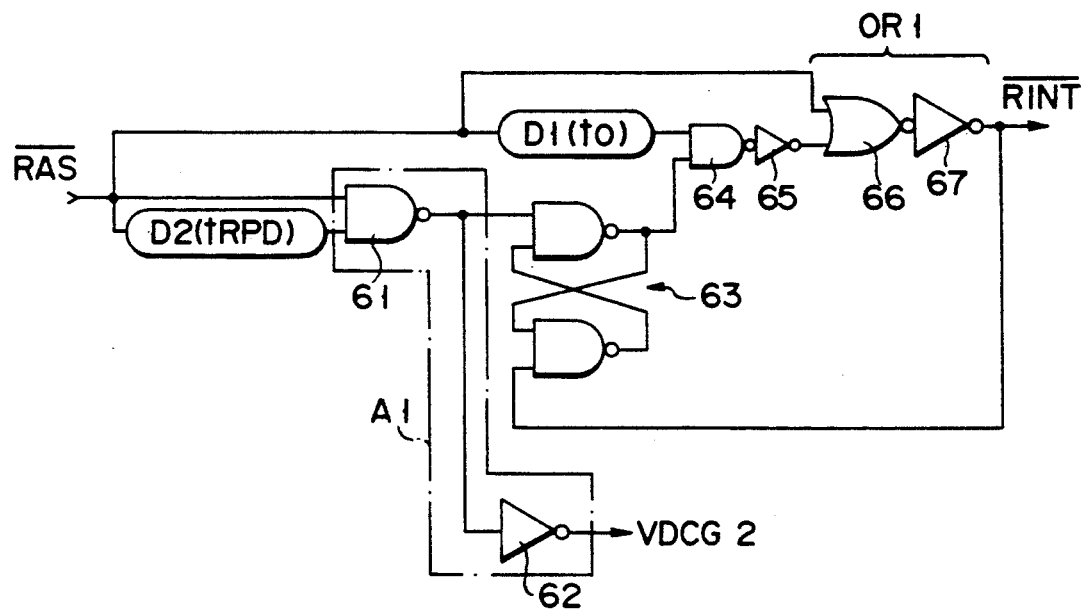
FIG. 6A is a circuit diagram showing an example of a circuit for generating a signal VDCG2 shown in FIG. 2.

FIG. 6A shows an example of a circuit for generating the signal VDCG2 and shows a modification of the circuit shown in FIG. 4. Portions which are the same as those of FIG. 4 are denoted by the same reference numerals and the explanation therefore is omitted.

An AND circuit A1 is constituted by a NAND circuit 61 and an inverter 62. A /RAS and a signal obtained by delaying the /RAS by means of a delay circuit D2 having delay time of $t_{RPD}$ are supplied to the input terminals of the NAND circuit 61. The output terminal of the NAND circuit 61 is connected to the inverter circuit 62 and a signal VDCG2 is output from the inverter circuit 62. The output terminal of the NAND circuit 61 is connected to one of the input terminals of a flip-flop circuit 63. The output terminal of the flip-flop circuit 63 is connected to one of the input terminals of a NAND circuit 64. The other input terminal of the NAND circuit 64 is connected to the output terminal of the delay circuit D1 for delaying the /RAS by time of t0. The output terminal of the NAND circuit 64 is connected to one of the input terminals of a NOR circuit 66 via an inverter circuit 65. The other input terminal of the NOR circuit 66 is supplied with the /RAS. The output terminal of the NOR circuit 66 is connected to an inverter circuit 67 and the /RINT is output from the output terminal of the inverter circuit 67. The /RINT is supplied to the control signal generation circuit CG shown in FIG. 4 and to the other input terminal of the flip-flop circuit 63.

Figure 6B:
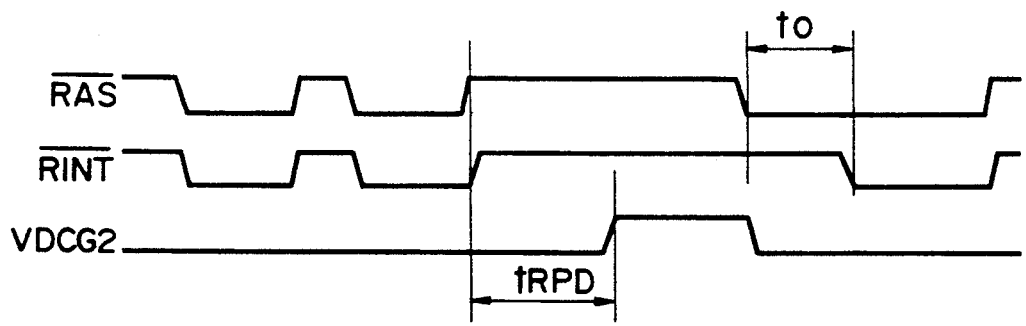
FIG. 6B is a waveform diagram for illustrating the operation of the circuit shown in FIG. 6A.

With the above construction, as shown in FIG. 6B, the VDCG2 which is delayed by time of $t_{RPD}$ with respect to the /RAS can be generated. The operation of the peripheral circuit can be delayed by the time of $t_{RPD}$ by use of the signal VDCG2. Further, if the /RAS is kept at the high level for more than the time of $t_{RPD}$, the delay circuit D1 shown in FIG. 6A is operated and the /RINT is set to the low level with time delay of t0 when the /RAS is set to the low level. However, in the high-speed operation in which the /RAS is kept at the high level for a period of time shorter than $t_{RPD}$, the delay circuit D1 is not operated and the /RINT and the /RAS are set to be synchronized with each other so that it is not necessary to wait for reception of the row address.

In the above embodiment, prevention of the flow of through current in the reference potential generation circuit of the dynamic memory was explained. However, it is also possible to prevent the flow of through current in another portion in which the through current will flow in the same manner as described above by using this invention.

FIG. 7 shows a second embodiment of this invention. The circuit of this embodiment includes a circuit section 70a in which a through current flows and a circuit section 70b in which no through current occurs. The circuit section 70a in which a through current flows includes peripheral circuits 71, 72 and 73 having a portion in which wirings are short-circuited. The circuit section 70b in which no through current flows includes normal peripheral circuits 74, 75 and 76. In this embodiment, a transistor 78 is connected between the power source line and a line 77 to which are connected the peripheral circuits 71, 72 and 73 in which a through current flows. The transistor 78 is controlled by the signal VDCG1. With the above construction, the flow of through current in the stand-by state can be prevented.

FIG. 8 shows a third embodiment of this invention. The third embodiment schematically shows an example of a dynamic memory containing a power source voltage conversion circuit for reducing the power source voltage.

The power source voltage conversion circuit 81 is connected between the power sources Vcc and Vss. A transistor 83 which is controlled by the signal VDCG1 is connected between the power source voltage conversion circuit 81 and a peripheral circuit 82 of the dynamic memory. The peripheral circuit 82 includes a reference potential generation circuit and a bit line potential creation circuit, for example.

Figure 16:
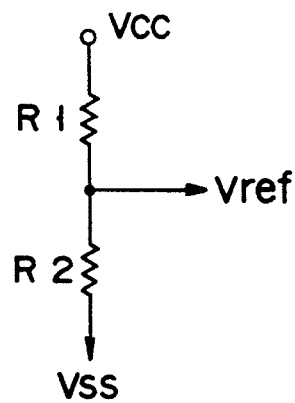
FIG. 16 is a circuit diagram of a conventional reference potential generation circuit.

In the above dynamic memory, the power source voltage conversion circuit 81 and the peripheral circuit 82 are electrically separated from each other by the transistor 83 in the stand-by state. Therefore, when a reference potential generation circuit constituted only by resistors as shown in FIG. 16 is used as the power source voltage conversion circuit 81, the through current flow can be prevented.

FIG. 9 shows a case wherein a plurality of power source voltage conversion circuits 81a and 81b are provided in the dynamic memory, a peripheral circuit 82a of the dynamic memory in which a through current flows is connected to the power source voltage conversion circuit 81a, and a peripheral circuit 82b of the dynamic memory in which no through current flows is connected to the power source voltage conversion circuit 81b. In this case, if a transistor 83a which is controlled by the VDCG1 is connected only between the peripheral circuit 82a in which a through current flows and the power source voltage conversion circuit 81a, the same effect as in the former embodiment can be obtained.

In the above first to third embodiments, a case wherein no defect occurs in the memory cell array and a through current flows in the peripheral circuit is explained. However, actually, the memory cell array may become partly defective by variation in the manufacturing process. In this case, the defective part is compensated for by use of the redundancy technique and all of the bits are used as effective bits, but if the short circuit occurs in the defective part, a through current will flow there. As the defective part, the short circuit between the word line and bit line may occur, and in this case, cells disposed in the row and column directions intersecting at the short-circuited point will become defective.

The word line may be set at the Vss level in the stand-by state in order to prevent erroneous selection and the bit line may be set at a preset potential level, for example, $V_{BL}=\frac{1}{2}Vcc$ by the bit line potential generation circuit in order to make ready for the sensing operation. Therefore, in a case where the bit line and the word line are short-circuited, a through current will flow in the stand-by state.

Figure 10:
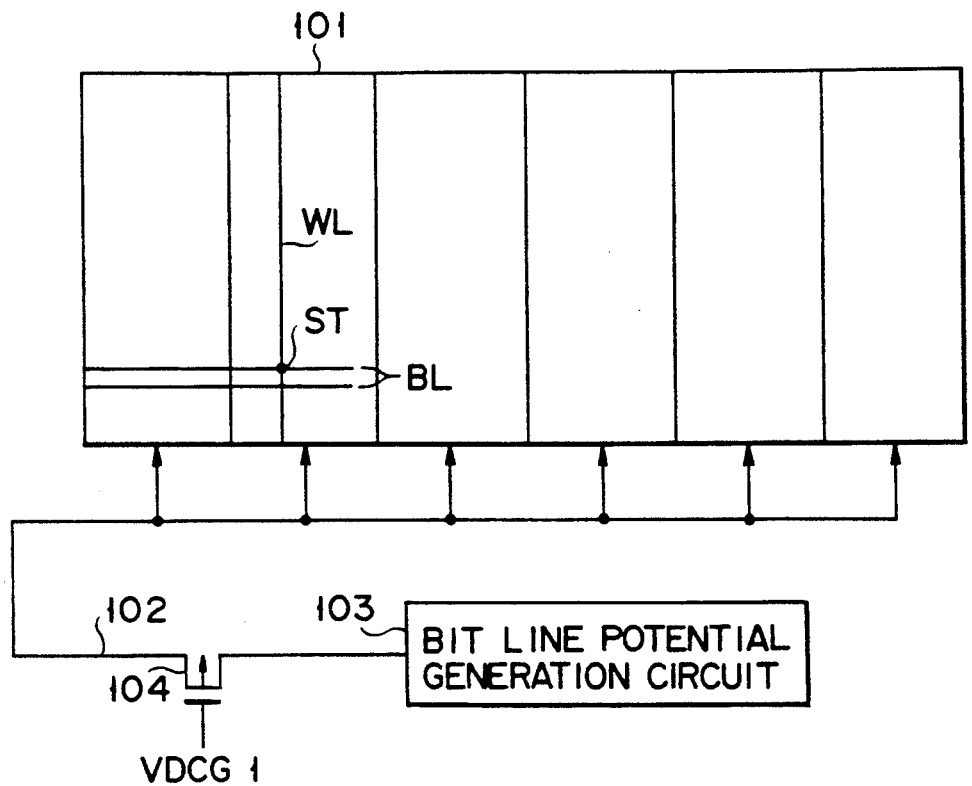
FIG. 10 is a constructional view showing a fourth embodiment of this invention.

FIG. 10 shows a fourth embodiment of this invention which is designed to prevent the flow of through current caused by the short circuit between the bit line and the word line.

In FIG. 10, a memory cell array 101 includes a short-circuited portion ST between a bit line BL and a word line WL. A bit line potential generation circuit 103 for generating the potential of the bit line is connected to the memory cell array 101 via a line 102. A transistor 104 is connected to the line 102 and the transistor 104 is controlled by a signal VDCG1.

With the above construction, since the /RAS is set at the high level in the stand-by state, the signal VDCG1 is also set to the high level to turn off the transistor 104. Therefore, an output signal of the bit line potential generation circuit 103 is interrupted so as to prevent the flow of through current. However, with the above construction, if time for the stand-by state is long, the potential of the bit line is completely discharged and time for charging the bit line to start the operation again becomes long.

Figure 11:
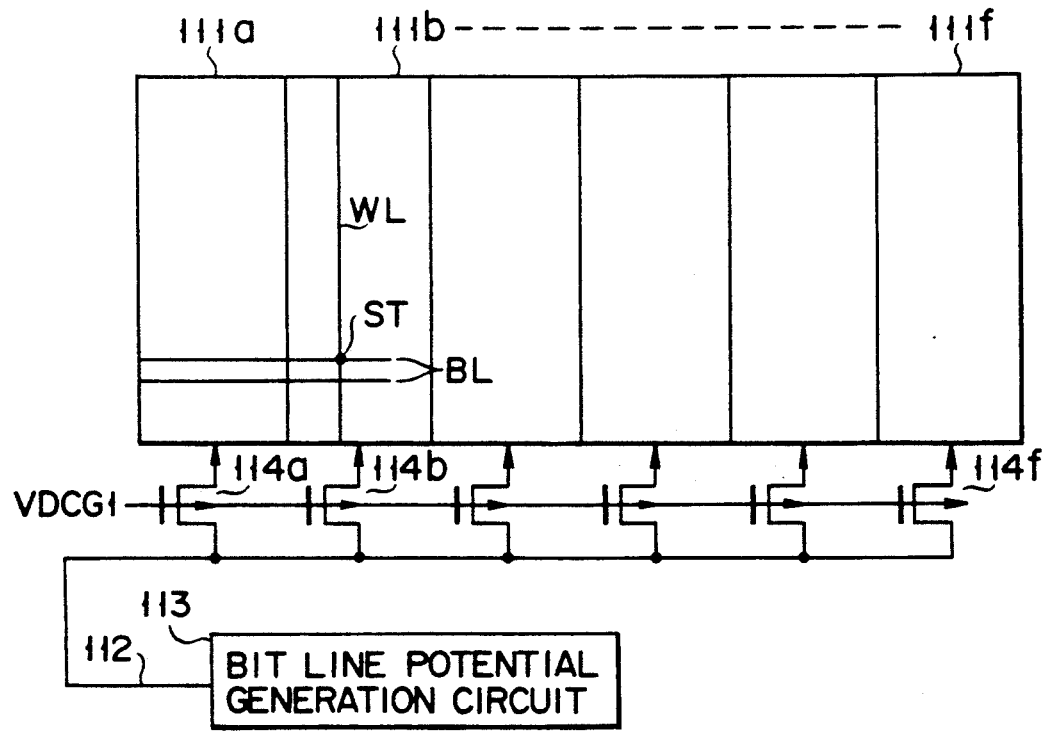
FIG. 11 is a constructional view showing a fifth embodiment of this invention.

FIG. 11 shows a fifth embodiment of this invention in which time for charging the bit line is shortened.

In this embodiment, transistors 114a, 114b to 114f are connected between memory cell arrays 111a, 111b to 111f and a line 112. The transistors 114a, 114b to 114f are controlled by the signal VDCG1. The line 112 is connected to a bit line potential generation circuit 113 for generating the bit line potential.

With the above construction, since the bit line potential is kept applied to the line 112 from the potential generation circuit 113, time for charging the bit line can be shortened by 1/(the number of memory cell arrays) in comparison with the case shown in FIG. 10.

Figure 12:
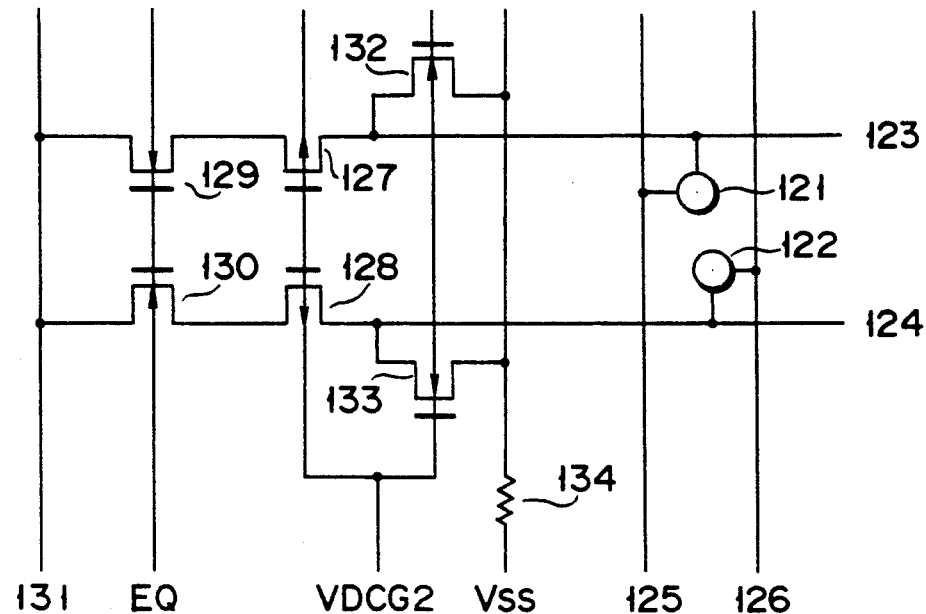
FIG. 12 is a circuit diagram showing a sixth embodiment of this invention.

FIG. 12 shows a sixth embodiment in which the bit line potential can be cut off for each bit line.

Memory cells 121 and 122 are connected to bit lines 123 and 124 and word lines 125 and 126. The bit line 123 is connected to a line 131 to which a bit line potential is applied via a p-channel transistor 127 and an n-channel transistor 129, and the bit line 124 is connected to the line 13 to which the bit line potential is applied via a p-channel transistor 128 and an n-channel transistor 130. The p-channel transistors 127 and 128 are controlled by the signal VDCG2 and the n-channel transistors 129 and 130 are controlled by an equalizing signal EQ which is generated by the ATD 153 shown in FIG. 15 according to the change of an address signal. Further, the bit lines 123 and 124 are coupled to a preset potential Vss via n-channel transistors 132 and 133 and a resistor 134. The n-channel transistors 132 and 133 are controlled by the signal VDCG2.

With the above construction, time for charging the bit lines 123 and 124 can be further shortened.

Figure 13:
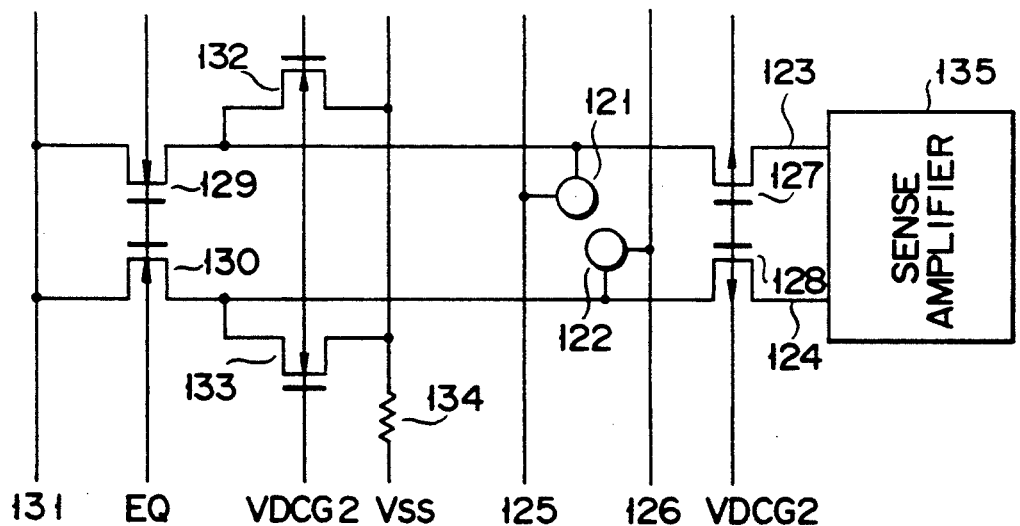
FIG. 13 is a circuit diagram showing a seventh embodiment of this invention.

FIG. 13 shows a seventh embodiment of this invention which is a modification of the circuit shown in FIG. 12, and portions which are the same as those of FIG. 12 are denoted by the same reference numerals.

In this embodiment, p-channel transistors 127 and 128 are connected to bit lines 123 and 124 which respectively lie between memory cells 121 and 122 and a sense amplifier 135 The p-channel transistors 127 and 128 are controlled by a signal VDCG2. Further, n-channel transistors 129 and 130 are used to electrically separate the bit lines 123 and 124 from a line 131 to which a bit line potential is applied according to an equalizing signal EQ.

In the embodiments shown in FIGS. 12 and 13, the bit lines 123 and 124 are set in the electrically floating state in the stand-by state. Assuming that the bit line is completely set in the electrically floating state, the bit lines 123 and 124 will be set to a negative potential by the substrate potential $V_{BB}$ and the transfer gate of a cell transistor is turned on to destroy data even if the potential of the word line is at 0 V. Therefore, it becomes necessary to set the bit line to a potential of Vcc/2 or Vss, Vcc by means of a resistor 134 of high resistance. The resistance must be set to a sufficiently large value so that the stand-by current may become sufficiently small and may be sufficiently smaller than the leakage current in the PN junction without influencing the normal sensing operation. The resistance may be set in a range from approx. 10 GΩ to 1 TΩ.

In FIG. 13, the bit lines 123 and 124 are coupled to the preset potential Vss via the transistors 132 and 133 and resistor 134, but this invention is not limited to this example, and the bit lines 123 and 124 may be coupled to the preset potential Vss via resistors 136 and 137 as shown in FIG. 14.

Further, in each of the embodiments, the signals VDCG1 and VDCG2 used are explained to be synchronized with the /RAS because the p-channel transistors are used, but when n-channel transistors are used, a signal having an inverted form of the /RAS may be used.

Further, this invention can be variously modified without departing from the technical scope thereof.

What is claimed is:

1. A current control circuit for a dynamic memory comprising:
   a memory cell array for storing data;
   a latch circuit for latching address data for selecting said memory cell array according to a readout control signal for reading out data and a reference voltage for determining "1" or "0" of the address data, the readout control signal having a readout state for reading out data and a stand-by state in which no data is read out;
   a reference voltage generation circuit having a resistor connected between first and second power sources, for generating the reference voltage; and
   an interruption circuit connected between said first power source and said resistor, for interrupting the current path between said first and second power sources.

2. A circuit according to claim 1, wherein said reference voltage generation circuit includes first and second resistors connected between said first and second power sources and an output node connected between said first and second resistors to output the reference voltage, and said interruption circuit includes a first transistor connected between said output node and said first resistor and a second transistor connected between said output node and said second resistor, said first and second transistors being set in the off state when said readout control signal is set in the stand-by state.

3. A circuit according to claim 2, wherein said readout control signal is a /RAS (row address strobe).

4. A current control circuit for a dynamic memory comprising:
   a memory cell array for storing data;
   a latch circuit for latching address data for selecting said memory cell array according to a readout control signal for reading out data and a reference voltage for determining "1" or "0" of the address data, the readout control signal having a readout state for reading out data and a stand-by state in which no data is read out;
   a reference voltage generation circuit having a resistor connected between first and second power sources, for generating the reference voltage;
   an interruption circuit connected between said first power source and said resistor, for interrupting the current path between said first and second power sources; and
   a delay circuit for delaying supply of the readout address to said latch circuit until the reference voltage reaches a preset level when the readout control signal is set into the readout state.

5. A circuit according to claim 4, wherein said reference voltage generation circuit includes first and second resistors connected between said first and second power sources and an output node connected between said first and second resistors to output the reference voltage, and said interruption circuit includes a first transistor connected between said output node and said first resistor and a second transistor connected between said output node and said second resistor, said first and second transistors being set in the off state when said readout control signal is set in the stand-by state.

6. A circuit according to claim 4, wherein said delay circuit includes a delay circuit for delaying the readout control signal by a preset period of time; an OR circuit having one input terminal supplied with the readout control signal and the other input terminal supplied with an output signal of said delay circuit; and a signal generation circuit for generating a timing signal for controlling the latching timing of said latch circuit according to an output signal of said OR circuit.

7. A circuit according to claim 6, wherein said interruption circuit includes a delay circuit for delaying the readout control signal by a preset period of time; and an AND circuit having one input terminal supplied with the readout control signal and the other input terminal supplied with an output signal of said delay circuit, for detecting that the readout control signal is set at the high level for more than a preset period of time.

8. A circuit according to claim 7, wherein said readout control signal is a /RAS (row address strobe).

9. A current control circuit for a dynamic memory comprising:
   a memory cell array for storing data;
   a peripheral circuit for reading out data from said memory cell array according to a readout control signal, the readout control signal having a readout state for reading out data and a stand-by state in which no data is read out;
   a power source conversion circuit for converting a power source voltage to a preset potential and supplying the same to said peripheral circuit; and
   an interruption circuit connected between said power source conversion circuit and said peripheral circuit, for interrupting supply of the potential from said power source conversion circuit to said peripheral circuit when said readout control signal is set in the stand-by state.

10. A circuit according to claim 9, wherein said readout control signal is a /RAS (row address strobe) and said interruption circuit includes a transistor which is connected between said power source conversion circuit and said peripheral circuit and is set into the off state when the /RAS is set at the high level.

11. A current control circuit for a dynamic memory comprising:
   a memory cell for storing data;
   a bit line for selecting said memory cell;
   a potential source for supplying a potential to said bit line; and
   a interruption circuit connected between said bit line and said potential source, for interrupting supply of a potential to said bit line when the readout control signal is set in the stand-by state.

12. A current control circuit for a dynamic memory comprising:
   a memory cell for storing data;
   a bit line for selecting said memory cell;
   a potential source for supplying a potential to said bit line;
   an interruption circuit connected between said bit line and said potential source, for interrupting supply of a potential to said bit line when the readout control signal is set in the stand-by state; and
   a supply circuit connected between said bit line and a preset potential Vss, for supplying a potential substantially equal to the potential to said bit line when the readout control signal is set in the stand-by state.

13. A circuit according to claim 12, wherein said supply circuit includes a transistor which has a current path connected at one end to said bit line and is set in the ON state when the readout control signal is set in the stand-by state and a resistor connected between the other end of the current path of said transistor and said preset potential.

14. A circuit according to claim 12, wherein said readout control signal is a /RAS (row address strobe) and said interruption circuit includes a transistor which is set in the OFF state when the /RAS is set in the high level.

* * * * *